United States Patent
Li et al.

(10) Patent No.: US 12,056,998 B2
(45) Date of Patent: Aug. 6, 2024

(54) FIRE MONITORING SYSTEM AND CONTAINER-TYPE DATA CENTER SYSTEM

(71) Applicant: INSPUR SUZHOU INTELLIGENT TECHNOLOGY CO., LTD., Jiangsu (CN)

(72) Inventors: Junshan Li, Jiangsu (CN); Zhenyu Zhang, Jiangsu (CN)

(73) Assignee: INSPUR SUZHOU INTELLIGENT TECHNOLOGY CO., LTD., Jiangsu (CN)

(*) Notice: Subject to any disclaimer, the term of this patent is extended or adjusted under 35 U.S.C. 154(b) by 53 days.

(21) Appl. No.: 17/914,837

(22) PCT Filed: Jul. 24, 2020

(86) PCT No.: PCT/CN2020/104003
§ 371 (c)(1),
(2) Date: Sep. 27, 2022

(87) PCT Pub. No.: WO2021/196460
PCT Pub. Date: Oct. 7, 2021

(65) Prior Publication Data
US 2023/0148089 A1    May 11, 2023

(30) Foreign Application Priority Data
Mar. 31, 2020   (CN) .......... 202010244664.8

(51) Int. Cl.
*G08B 17/103*   (2006.01)
*G08B 17/12*    (2006.01)

(52) U.S. Cl.
CPC .......... *G08B 17/103* (2013.01); *G08B 17/12* (2013.01)

(58) Field of Classification Search
CPC .... G01N 21/00; G01N 21/59; G01N 21/3504; G01N 21/72; F21V 9/00; F24C 5/16; G08B 17/117; A61M 13/00; A61M 13/006; B01D 46/00
See application file for complete search history.

(56) References Cited

U.S. PATENT DOCUMENTS

| | | |
|---|---|---|
| 5,331,310 A | 7/1994 | Stetter et al. |
| 5,764,150 A | 6/1998 | Fleury et al. |
| 5,949,235 A | 9/1999 | Castleman et al. |
| 2005/0263705 A1* | 12/2005 | Asatani .................... F24C 5/16 250/341.1 |

(Continued)

FOREIGN PATENT DOCUMENTS

| | | |
|---|---|---|
| AU | 1972170 A | 3/1972 |
| AU | 2008201308 A1 | 10/2008 |

(Continued)

OTHER PUBLICATIONS

NPL Search (Dec. 14, 2023).*

(Continued)

*Primary Examiner* — Van T Trieu
(74) *Attorney, Agent, or Firm* — Cooper Legal Group LLC

(57) ABSTRACT

A fire monitoring system and a container-type data center system. The fire monitoring system includes a filtering apparatus, a detection apparatus, and a control apparatus. The filtering apparatus includes a first stage filter and a second stage filter.

18 Claims, 4 Drawing Sheets

(56) References Cited

U.S. PATENT DOCUMENTS

| | | | | |
|---|---|---|---|---|
| 2011/0058167 | A1* | 3/2011 | Knox | ............... H04N 7/18 |
| | | | | 356/338 |
| 2012/0140231 | A1* | 6/2012 | Knox | ............ G01N 15/1434 |
| | | | | 356/442 |
| 2014/0283144 | A1 | 9/2014 | Gettings et al. | |
| 2015/0170490 | A1* | 6/2015 | Shaw | ............... G01N 21/53 |
| | | | | 250/214.1 |
| 2019/0383557 | A1* | 12/2019 | Jensen | ............. F26B 25/009 |
| 2022/0152321 | A1* | 5/2022 | Haber | ............... B01D 46/46 |

FOREIGN PATENT DOCUMENTS

| | | |
|---|---|---|
| CN | 2061311 U | 8/1990 |
| CN | 1057538 A | 1/1992 |
| CN | 2349575 Y | 11/1999 |
| CN | 1242095 A | 1/2000 |
| CN | 1871624 A | 11/2006 |
| CN | 101285717 A | 10/2008 |
| CN | 101392934 A | 3/2009 |
| CN | 101727727 A | 6/2010 |
| CN | 201716810 U | 1/2011 |
| CN | 201749535 U | 2/2011 |
| CN | 102314745 A | 1/2012 |
| CN | 102364016 A | 2/2012 |
| CN | 203433623 U | 2/2014 |
| CN | 203842481 U | 9/2014 |
| CN | 203870754 U | 10/2014 |
| CN | 104408864 A | 3/2015 |
| CN | 105444238 A | 3/2016 |
| CN | 205405791 U | 7/2016 |
| CN | 108305426 A | 7/2017 |
| CN | 206684890 U | 11/2017 |
| CN | 206726404 | 12/2017 |
| CN | 207096040 U | 3/2018 |
| CN | 207164946 U | 3/2018 |
| CN | 107945449 A | 4/2018 |
| CN | 107990696 A | 5/2018 |
| CN | 109406356 A | 3/2019 |
| CN | 109490487 A | 3/2019 |
| CN | 109544847 A | 3/2019 |
| CN | 110812964 A | 2/2020 |
| DE | 102013017395 B3 | 12/2014 |
| EP | 0324295 A2 | 7/1989 |
| EP | 2156126 A1 | 2/2010 |
| JP | H02173896 A | 7/1990 |
| JP | H0744783 A | 2/1995 |
| JP | 2009042965 A | 2/2009 |
| KR | 20130071023 A | 6/2013 |
| KR | 20160091709 A | 8/2016 |
| SU | 1173431 A1 | 8/1985 |
| WO | 2013024935 A1 | 2/2013 |

OTHER PUBLICATIONS

International Search Report and English Translation cited in PCT/CN2020/104003, mailed Jan. 4, 2021, 8 pages.

Li Linquan, 2. "Air supply system", New medicine development and research, the second part, p. 1029, Dec. 31, 2008 (Unofficial translation); 3 pages.

First Office Action of corresponding CN priority application CN202010244664.8, dated Dec. 17, 2020; 18 pages.

Second Office Action of corresponding CN priority application CN202010244664.8, dated May 19, 2021; 20 pages.

Notification to Grant Patent Right for Invention of corresponding CN priority application CN202010244664.8 dated Oct. 25, 2021; 3 pages.

Xie Qi-yuan et.al., "Study on the False Alarms of Smoke Detector Caused by Moisture", State Key Laboratory of Fire Science, USTC, entire document with English Abstract, Jan. 31, 2004; 6 pages.

Li Tangbing et al., 8.3.2 "Photoelectric smoke detectors", Building Electrical and Safe use of electricity, pp. 160-161, May 31, 2018 (Unofficial translation); 6 pages.

* cited by examiner

FIRE MONITORING SYSTEM AND CONTAINER-TYPE DATA CENTER SYSTEM

This application claims priority to Chinese Patent Application No. 202010244664.8, filed on Mar. 31, 2020, in China National Intellectual Property Administration and entitled "Fire Monitoring System and Container-Type Data Center System", the contents of which are hereby incorporated by reference in its entirety.

FIELD

The present disclosure relates to the field of container-type data centers, and particularly to a fire monitoring system and a container-type data center system.

BACKGROUND

Currently, the container-type data center is a relatively common data center construction form. Such a data center is often constructed outdoors or even at a relatively remote position, which makes a high requirement for unattended operation of the data center. There is a relatively important technical problem in the application of the unattended operation of the data center, i.e., fire detection. Currently, the most common fire detection method is detecting by a smoke detector and a thermal detector, which lags behind the appearance of fire. To solve this problem, very early detection is mostly used. The main principle of very early detection is to actively suck a detection gas into a detection cavity, then detect a particulate matter in the gas, and prejudge a fire according to a detection result. At present, an optical detection solution is mostly used for gas detection. However, considering the possible presence of water mist in the gas, water drops may be mistaken for dust particles during optical detection. As a result, the accuracy of the detection result is affected, leading to a misjudgment of the fire.

Therefore, how to solve the foregoing technical problem is a problem that those skilled in the art need to solve at present.

SUMMARY

An objective of the present application is to provide a fire monitoring system and a container-type data center system. It may be ensured that a second stage filtered gas entering a detection apparatus includes no water mist and dust, so a detection result is not affected by water mist, and the reliability and accuracy of the fire monitoring system are improved.

In order to solve the foregoing technical problem, the present application provides a fire monitoring system, including:
  a filtering apparatus, including a first stage filter and a second stage filter, wherein the first stage filter is configured to filter water mist in a gas to be detected in a container-type data center system to obtain a first stage filtered gas, and the second stage filter is configured to filter dust in the first stage filtered gas to obtain a second stage filtered gas;
  a detection apparatus, including a linear airflow channel communicated with the second stage filter by means of a gas detecting tube, as well as a laser transmitter and laser intensity detector that are arranged at both ends of the airflow channel respectively, wherein the laser transmitter is configured to transmit a laser signal, and the laser intensity detector is configured to obtain a laser intensity of the laser signal;
  a control apparatus electrically connected with the laser intensity detector, configured to determine whether the obtained laser intensity meets a fire early warning condition, and if YES, implement an early warning measure.

In some embodiments, the first stage filter includes:
  a condensation chamber, provided with a gas inlet;
  a heating chamber, wherein a gas inlet of the heating chamber is communicated with a gas outlet of the condensation chamber, and the heating chamber is provided with a gas outlet connected with the second stage filter;
  a thermoelectric device, wherein a cold end of the thermoelectric device is connected with the condensation chamber so as to cool the gas in the condensation chamber, and a hot end of the thermoelectric device is connected with the heating chamber, and controls the cooled gas to be heated.

In some embodiments, a condensation section vapor chamber is arranged at the cold end of the thermoelectric device, and multiple condenser tubes extending into the condensation chamber are arranged on the condensation section vapor chamber; and/or, a heating section vapor chamber is arranged at the hot end of the thermoelectric device, and multiple heating tubes extending into the heating chamber are arranged on the heating section vapor chamber.

In some embodiments, a first stage filter second drainage port is formed in a bottom of the condenser tube.

In some embodiments, the first stage filter further includes a first stage filter housing. The condensation chamber, the heating chamber, and the thermoelectric device are all arranged in the first stage filter housing. A first stage filter first drainage port below the condensation section vapor chamber is formed in a bottom of the first stage filter housing.

In some embodiments, the condensation chamber is communicated with the heating chamber by means of a chamber connecting corridor. The chamber connecting corridor includes a chamber connecting corridor shell. A baffle plate configured to increase a flowing path of the gas is arranged in the chamber connecting corridor shell.

In some embodiments, a drainage channel configured for liquid separated from the gas to flow out is formed in a bottom of the chamber connecting corridor shell.

In some embodiments, the filtering apparatus further includes:
  a third stage filter, configured to filter a particulate matter in the second stage filtered gas to obtain a third stage filtered gas.

In some embodiments, the fire monitoring system further includes:
  a booster pump arranged on a clean gas tube. The clean gas tube is communicated with the gas detecting tube. The booster pump is configured to drive the third stage filtered gas to purge the laser transmitter and the laser intensity detector.

In some embodiments, the fire monitoring system further includes:
  a gas detecting tube electric valve arranged on the gas detecting tube, and a clean gas tube electric valve arranged on the clean gas tube.

Correspondingly, the control apparatus is further configured to, according to a current working condition, control the gas detecting tube electric valve to be turned on and control the clean gas tube electric valve to be turned off, or according to a current working condition, control the gas detecting tube electric valve to be turned off and control the clean gas tube electric valve to be turned on.

In some embodiments, the fire monitoring system further includes:
a gas detector, configured to monitor a toxic gas and/or harmful gas and/or combustible gas in the gas to be detected.

In some embodiments, the fire monitoring system further includes:
a gas receiving apparatus, including multiple air inlet manifolds in one-to-one correspondence to multiple monitoring regions in the container-type data center system, each air inlet manifold being configured to obtain the gas to be detected in the corresponding monitoring region, and a main air inlet pipe connected with each air inlet manifold, an air pump configured to drive the gas to be detected being arranged on the main air inlet pipe.

In some embodiments, the fire monitoring system further includes:
an air cleanliness detection apparatus, configured to obtain air cleanliness data of the container-type data center system according to the first stage filtered gas.

Correspondingly, the control apparatus is further configured to control the filtering apparatus, the detection apparatus, and the gas receiving apparatus to stop running when the air cleanliness data is less than a first preset value.

In some embodiments, the gas receiving apparatus further includes an air inlet manifold electric valve arranged on each air inlet manifold.

Correspondingly, the control apparatus is further configured to control all of the air inlet manifold electric valves to be turned on when the fire early warning condition is not met, control each air inlet manifold electric valve to be sequentially turned on when the fire early warning condition is met, and when controlling each air inlet manifold electric valve to be turned on, control all of the other air inlet manifold electric valves to be turned off.

In some embodiments, the control apparatus is configured to wait for a first preset time period after controlling each valve to be turned on, then determine whether the obtained laser intensity meets the fire early warning condition, and if YES, implement the early warning measure.

In some embodiments, the control apparatus includes a processor. The processor includes:
a calculation module, configured to calculate a weighted average corresponding to all laser intensities received within a second preset time period, and determine the weighted average as an actual laser intensity;
a comparison module, configured to compare the actual laser intensity with a preset alarm threshold;
a processing module, configured to determine whether the fire early warning condition is met according to a comparison result, and if YES, implement the early warning measure.

In some embodiments, the preset alarm threshold includes preset alarm thresholds in one-to-one correspondence to multiple smoke grades.
the comparison module is configured to compare the actual laser intensity with each preset alarm threshold; and
the processing module is configured to determine whether the fire early warning condition is met according to a comparison result, and if YES, determine a current smoke grade and implement an early warning measure corresponding to the current smoke grade.

In some embodiments, the control apparatus further includes:
multiple relays in one-to-one correspondence to the smoke levels; the processor is connected with a control loop corresponding to the early warning measure through the relay.

Correspondingly, the process of implementing an early warning measure corresponding to the current smoke grade includes:
controlling the relay corresponding to the current smoke grade to be turned on.

In some embodiments, the processor further includes:
a preprocessing module, configured to obtain an actual laser intensity corresponding to each smoke grade when a smoke generator simulates smoke of the multiple smoke grades in a target monitoring region;
a curve processing module, configured to obtain a first curve of time-dependent variation of the actual laser intensity and a second curve of time-dependent variation of the smoke grade;
a threshold determination module, configured to determine the preset alarm thresholds in one-to-one correspondence to the smoke grades in the target monitoring region according to the first curve and the second curve, wherein the target monitoring region is any one of the multiple monitoring regions in the container-type data center system.

In order to solve the foregoing technical problem, the present application also provides a container-type data center system, including the fire monitoring system as described above.

The present application provides a fire monitoring system. A first stage filter and a second stage filter are sequentially arranged in a detection flow channel where a gas to be detected flows, wherein the first stage filter is configured to filter water mist in the gas to be detected, and the second stage filter is configured to filter dust in the gas to be detected. According to the setting solution of the present application, it may be ensured that a second stage filtered gas entering a detection apparatus includes no water mist and dust, so a detection result is not affected by the water mist, and is highly reliable. The water mist in the gas to be detected is filtered first, whereby the damp dust may be prevented from clinging to the second stage filter, and the service life of the second stage filter is ensured. In addition, in the present application, a laser transmitter and a laser intensity detector are arranged at both ends of a linear airflow channel respectively. Therefore, a laser intensity detected by the laser intensity detector corresponds to light remaining after reflection by a particulate matter in the second stage filtered gas, and a situation of the particulate matter in the second stage filtered gas may be reflected more directly. Meanwhile, use of the linear airflow channel may increase the probability that the particulate matter blocks a laser signal and detect the detection sensitivity, such that a control apparatus may prejudge a fire more accurately, improving the reliability and accuracy of the fire monitoring system. The present application also provides a container-type data center system, which has the same beneficial effects as the fire monitoring system.

BRIEF DESCRIPTION OF THE DRAWINGS

In order to describe the technical solutions in embodiments of the present disclosure more clearly, the drawings required to be used in the prior art and the embodiments will be briefly introduced below. Apparently, the drawings in the description below are only some embodiments of the present disclosure. Those ordinarily skilled in the art may further obtain other drawings according to these drawings without creative work.

DETAILED DESCRIPTION

A core of the present application is to provide a fire monitoring system and a container-type data center system. It may be ensured that a second stage filtered gas entering a detection apparatus includes no water mist and dust, so a detection result is not affected by water mist, and the reliability and accuracy of the fire monitoring system are improved.

In order to make the objective, technical solutions, and advantages of the embodiments of the present application clearer, the technical solutions in the embodiments of the present application will be described clearly and completely below in combination with the drawings in the embodiments of the present application. Based on the embodiments of the present application, all other embodiments obtained by those skilled in the art without creative work shall fall within the protection scope of the present application.

Figure 1:
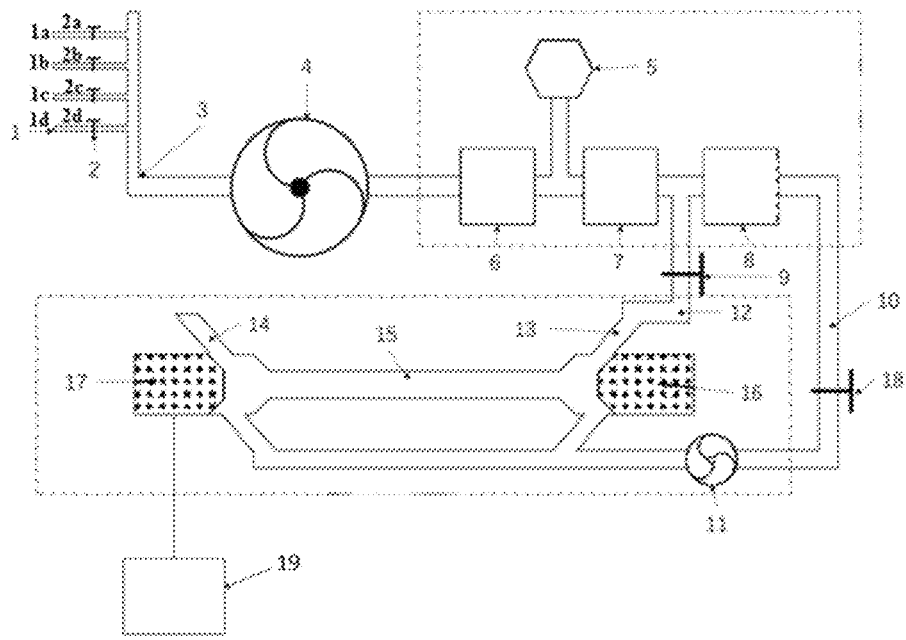
FIG. 1 is a schematic structural diagram of a fire monitoring system according to the present application.

Referring to FIG. 1, FIG. 1 is a schematic structural diagram of a fire monitoring system according to the present application. The fire monitoring system includes:

a filtering apparatus, including a first stage filter 6 and a second stage filter 7, wherein the first stage filter 6 is configured to filter water mist in a gas to be detected in a container-type data center system to obtain a first stage filtered gas, and the second stage filter 7 is configured to filter dust in the first stage filtered gas to obtain a second stage filtered gas;

a detection apparatus, including a linear airflow channel 15 communicated with the second stage filter 7 by means of a gas detecting tube 12, as well as a laser transmitter 16 and laser intensity detector 17 that are arranged at both ends of the airflow channel 15 respectively, wherein the laser transmitter 16 is configured to transmit a laser signal, and the laser intensity detector 17 is configured to obtain a laser intensity of the laser signal;

a control apparatus 19 electrically connected with the laser intensity detector 17, configured to determine whether the obtained laser intensity meets a fire early warning condition, and if YES, implement an early warning measure.

In some embodiments, a filtering apparatus and a detection apparatus are connected by means of a detection flow channel where a gas to be detected flows. Here, the gas to be detected is a gas to be detected sampled by a sampling apparatus from each monitoring region in a container-type data center system. A first stage filter 6, a second stage filter 7, and the detection apparatus are sequentially arranged in the detection flow channel in a flowing direction of the gas to be detected. The first stage filter 6 is configured to filter water mist in the gas to be detected. A first stage filtered gas is obtained after the gas to be detected is filtered by the first stage filter 6. The second stage filter 7 is configured to filter dust in the first stage filtered gas. A second stage filtered gas is obtained by the second stage filter 7 by filtering. In this embodiment, on one hand, filtering the water mist first and then the dust may ensure that a gas entering the detection apparatus includes no water mist and dust and avoid their interference to a detection result. On the other hand, filtering the water mist in the gas to be detected first may avoid damp dust clinging to the second stage filter 7, so as to ensure the service life of the second stage filter 7.

In some embodiments, the detection flowchart includes a gas detecting tube 12 and an airflow channel 15. A gas inlet 13 of the detection apparatus is communicated with the second stage filter 7 by means of the gas detecting tube 12. The airflow channel 15 in the detection apparatus is communicated with the gas inlet 13 of the detection apparatus. The second stage filtered gas obtained by the second stage filter 7 by filtering enters the gas inlet 13 of the detection apparatus through the gas detecting tube 12, so as to enter the airflow channel 15 of the detection apparatus. In this embodiment, the detection apparatus further includes a laser transmitter 16 and a laser intensity detector 17. The second stage filtered gas flows in the airflow channel 15. The laser transmitter 16 is configured to transmit a laser. When there is a particulate matter in the air, a laser intensity detected by the laser intensity detector 17 may decrease, and a control apparatus 19 may determine whether there is a very early fire based on this principle. In this embodiment, the laser transmitter 16 and the laser intensity detector 17 are arranged opposite to each other, and the airflow channel 15 is between them. As shown in FIG. 1, the detection apparatus in this embodiment is shaped like a dumbbell. It can be understood that the laser transmitter 16 and laser intensity detector 17 in this embodiment are arranged opposite to each other, so the laser intensity obtained by the laser intensity detector 17 corresponds to light remaining after reflection by the particulate matter, and a content of the particulate matter in the second stage filtered gas may be reflected more directly. Meanwhile, to increase the probability that the particulate matter blocks the laser, the airflow channel 15 selects an elongated linear airflow channel, to improve the detection sensitivity.

In some embodiments, the control apparatus 19 is electrically connected with the laser intensity detector 17, so as to obtain a signal output by the laser intensity detector 17 and corresponding to the laser intensity. The control apparatus 19 determines whether the laser intensity detected by the laser intensity detector 17 meets a fire early warning condition, if YES, implements a corresponding early warning measure, and if NO, continues monitoring. It can be understood that an alarm threshold is preset in the control apparatus 19. The laser intensity is compared with the alarm threshold, and if the laser intensity is less than the alarm threshold, it indicates that the fire early warning condition is met.

The present application provides a fire monitoring system. A first stage filter and a second stage filter are sequentially arranged in a detection flow channel where a gas to be detected flows, wherein the first stage filter is configured to filter water mist in the gas to be detected, and the second stage filter is configured to filter dust in the gas to be detected. According to the setting solution of the present application, it may be ensured that a second stage filtered gas entering a detection apparatus includes no water mist and dust, so a detection result is not affected by the water mist, and is highly reliable. The water mist in the gas to be detected is filtered first, whereby the damp dust may be prevented from clinging to the second stage filter, and the service life of the second stage filter is ensured. In addition, in the present application, a laser transmitter and a laser intensity detector are arranged at both ends of a linear airflow channel respectively. Therefore, a laser intensity detected by the laser intensity detector corresponds to light remaining after reflection by a particulate matter in the second stage filtered gas, and a situation of the particulate matter in the second stage filtered gas may be reflected more directly. Meanwhile, use of the linear airflow channel may increase the probability that the particulate matter blocks a laser signal and detect the detection sensitivity, such that a control apparatus may prejudge a fire more accurately, improving the reliability and accuracy of the fire monitoring system.

Figure 2:
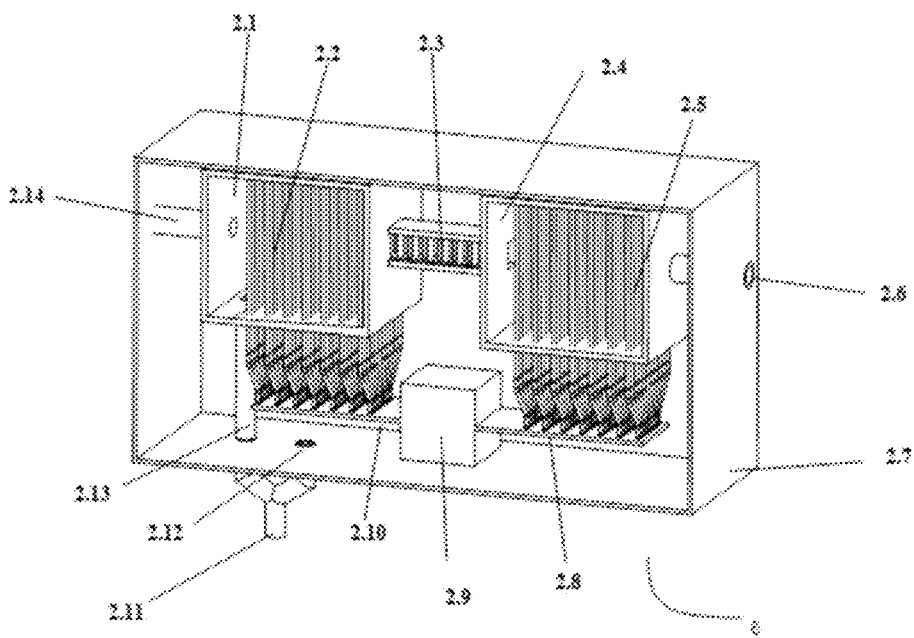
FIG. 2 is a schematic structural diagram of a first stage filter according to the present application.
Figure 3:
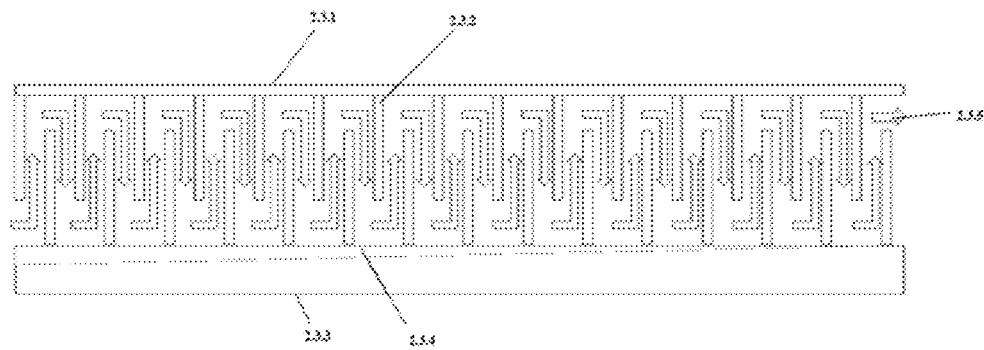
FIG. 3 is a schematic structural diagram of another first stage filter according to the present application.

Based on the above-mentioned embodiment, in some embodiments, the structure of the first stage filter 6 refers to FIGS. 2 and 3. The first stage filter 6 includes:

a condensation chamber 2.1, provided with a gas inlet;

a heating chamber 2.4, wherein a gas inlet of the heating chamber 2.4 is communicated with a gas outlet of the condensation chamber 2.1, and the heating chamber 2.4 is provided with a gas outlet connected with the second stage filter 7;

a thermoelectric device 2.9, wherein a cold end of the thermoelectric device 2.9 is connected with the condensation chamber 2.1 so as to cool the gas in the condensation chamber 2.1, and a hot end of the thermoelectric device 2.9 is connected with the heating chamber 2.4, and controls the cooled gas to be heated.

In some embodiments, the condensation chamber 2.1 is provided with a gas inlet, and the gas to be detected enters the condensation chamber 2.1 through the gas inlet. The heating chamber 2.4 is provided with a gas outlet, and the first stage filtered gas obtained after the water mist is filtered flows into the second stage filter 7 through the gas outlet.

In some embodiments, a condensation section vapor chamber 2.10 is arranged at the cold end of the thermoelectric device 2.9, and multiple condenser tubes 2.2 extending into the condensation chamber 2.1 are arranged on the condensation section vapor chamber 2.10; and/or, a heating section vapor chamber 2.8 is arranged at the hot end of the thermoelectric device 2.9, and multiple heating tubes extending into the heating chamber 2.4 are arranged on the heating section vapor chamber 2.8.

In some embodiments, a first stage filter second drainage port 2.13 is formed in a bottom of the condenser tube 2.2.

In some embodiments, the air in the first stage filter 6 is cooled (condensed) and then heated to remove water mist possibly present in the air. Reducing a temperature of the gas may separate part of water vapor in the gas to obtain water mist clinging to a condenser tube 2.2 in the condensation chamber 2.1, so as to reduce a humidity of the gas. Then, the gas is heated to raise the temperature of the gas. As such, formation of water mist may be prevented. It can be understood that, under certain pressure, a water vapor capacity of the air is related to the temperature of the air. If the temperature of the air is higher, the water vapor capacity is higher. The first stage filter 6 includes a thermoelectric device 2.9, which is a device prepared by use of a Peltier effect of a thermoelectric semiconductor. When the semiconductor is energized, heat may be sucked and released at both ends of the thermoelectric device 2.9 respectively, so as to achieve cooling at one end and heating at the other end.

In some embodiments, a condensation section vapor chamber 2.10 and a heating section vapor chamber 2.8 are arranged at a cold end and hot end of the thermoelectric device 2.9 respectively. Multiple condenser tubes 2.2 are arranged on the condensation section vapor chamber 2.10. Multiple heating tubes are arranged on the heating section vapor chamber 2.8. The multiple condenser tubes 2.2 extend into the condensation chamber 2.1 to cool the air here, and when the air humidity is relatively high, water vapor is separated from the air. Further, a large number of condenser tubes 2.2 are distributed in the condensation chamber 2.1, and a first stage filter second drainage port 2.13 is formed in a bottom of the condenser tube 2.2. Therefore, a cooling effect on the air may be ensured, and in addition, most of the separated water vapor may cling to the condenser tube 2.2, and is further discharged through the second drainage ports 2.13 of the first stage filter 6.

In some embodiments, the first stage filter 6 further includes a first stage filter housing 2.7. The condensation chamber 2.1, the heating chamber 2.4, and the thermoelectric device 2.9 are all arranged in the first stage filter housing 2.7. A first stage filter first drainage port 2.12 below the condensation section vapor chamber 2.10 is formed in a bottom of the first stage filter housing 2.7.

In some embodiments, a first stage filter first drainage port 2.12 below the condensation section vapor chamber 2.10 is formed in a bottom of the first stage filter housing 2.7 to discharge hot water that may be condensed on the condensation section vapor chamber 2.10 in the first stage filter 6.

In some embodiments, the condensation chamber 2.1 is communicated with the heating chamber 2.4 by means of a chamber connecting corridor 2.3. The chamber connecting corridor 2.3 includes a chamber connecting corridor 2.3 shell. A baffle plate 2.3.2 configured to increase a flowing path of the gas is arranged in the chamber connecting corridor 2.3 shell.

In some embodiments, a drainage channel 2.3.4 configured for liquid separated from the gas to flow out is formed in a bottom of the chamber connecting corridor 2.3 shell.

In some embodiments, the air flowing out of the condensation chamber 2.1 enters the chamber connecting corridor 2.3, and is blocked by the baffle plate 2.3.2 in the chamber connecting corridor 2.3, such that the water mist possibly present in the air clings to the baffle plate 2.3.2, and then enters the heating chamber 2.4 through the drainage channel 2.3.4 in the chamber connecting corridor 2.3. A large number of heating tubes are distributed in the heating chamber 2.4 to raise the temperature of the air and evaporate a small part of water mist that may remain into water vapor. By the process of cooling, condensation, and then heating, the humidity of a gas with a relatively high humidity is reduced by separation of water vapor, so formation of water mist is avoided.

In some embodiments, the drainage channel 2.3.4 is of a slope structure whose top surface is gradually lowered from a gas outlet of the chamber connecting corridor 2.3 shell to a gas inlet of the chamber connecting corridor 2.3 shell. Separated liquid flows into the heating chamber 2.4 through the slope structure.

In some embodiments, the fire monitoring system further includes:

a gas receiving apparatus, including multiple air inlet manifolds 1 in one-to-one correspondence to multiple monitoring regions in the container-type data center system, each air inlet manifold 1 being configured to obtain the gas to be detected in the corresponding monitoring region, and a main air inlet pipe 3 connected with each air inlet manifold 1, an air pump 4 configured to drive the gas to be detected being arranged on the main air inlet pipe 3.

It can be understood that there are multiple monitoring regions in the container-type data center system, each of which is configured with a sampling apparatus for subsequent fire positioning. The number of the air inlet manifolds 1 in the gas receiving apparatus is the same as that of the monitoring regions. Each sampling apparatus is connected in one-to-one correspondence with the air inlet manifold 1 in the fire monitoring system. The collected gas to be detected is delivered into the detection flow channel through the air inlet manifold 1. The gas to be detected in each air inlet manifold 1 flows into a main air inlet pipe 3. An air pump 4 configured to drive the gas to be detected is arranged on the main air inlet pipe 3. Under the action of the air pump 4, the gas to be detected enters the filtering apparatus. The filtering apparatus performs second stage filtering on the gas to be detected.

In some embodiments, the fire monitoring system further includes:
an air cleanliness detection apparatus 5, configured to obtain air cleanliness data of the container-type data center system according to the first stage filtered gas.

Correspondingly, the control apparatus 19 is further configured to control the filtering apparatus, the detection apparatus, and the gas receiving apparatus to stop running when the air cleanliness data is less than a first preset value.

In some embodiments, at present, to detect air cleanliness of each monitoring region in the container-type data center system, a set of pipeline is deployed for each monitoring region. As a result, not only the cost but also difficulties in pipeline laying construction and later maintenance are increased. In this embodiment, a pipeline for fire early warning detection may be reused for air cleanliness detection, so as to reduce the cost and difficulties in later maintenance.

In some embodiments, optical detection is mostly used for air cleanliness detection, and water drops may be mistaken for dust particles, affecting the accuracy of a detection result. Therefore, the air cleanliness detection apparatus 5 in this embodiment detects the air cleanliness according to the first stage filtered gas. Since the first stage filtered gas obtained by the first stage filter 6 by filtering includes no water mist, the interference of water mist to the detection result may be avoided, while dust particles may be prevented from clinging to the air cleanliness detection apparatus 5 and affecting its service life.

Further, after obtaining current air cleanliness data according to the first stage filtered gas, the air cleanliness detection apparatus 5 sends the current air cleanliness data to the control apparatus 19. It can be understood that a preset threshold is prestored in the control apparatus 19. When the air cleanliness data is less than the preset threshold, it indicates that the cleanliness of the air is quite low, namely there is so much dust in the air. There are many reasons for the presence of much dust in the air, including, but not limited to, flowing of outside air into the air cleanliness detection apparatus due to breakage of a pipeline between two containers, and flowing of outside dust into a container placed outdoors due to frequent opening and closing of the container. For device protection, the control apparatus 19 may control an alarm apparatus to give an alarm, and control the filtering apparatus, the detection apparatus, and the gas receiving apparatus to stop running for troubleshooting.

In some embodiments, the gas receiving apparatus further includes an air inlet manifold electric valve arranged on each air inlet manifold 1.

Correspondingly, the control apparatus 19 is further configured to control all of the air inlet manifold electric valves to be turned on when the fire early warning condition is not met, control each air inlet manifold electric valve to be sequentially turned on when the fire early warning condition is met, and when controlling each air inlet manifold electric valve to be turned on, control all of the other air inlet manifold electric valves to be turned off.

In some embodiments, the control apparatus 19 is configured to wait for a first preset time period after controlling each valve to be turned on, then determine whether the obtained laser intensity meets the fire early warning condition, and if YES, implement the early warning measure.

In some embodiments, if the laser intensity meets the fire early warning condition, it indicates that there is a fire hazard in the monitoring region, but the position of the fire is yet not determined exactly at this point. To position the fire, in this embodiment, an air inlet manifold electric vale is arranged on each air inlet manifold 1. Referring to FIG. 1, FIG. 1 takes four air inlet manifolds 1 as an example. The four air inlet manifolds 1 are referred to as a first air inlet manifold 1*a*, a second air inlet manifold 1*b*, a third air inlet manifold 1*c*, and a fourth air inlet manifold 1*d* respectively. The air inlet manifold electric valves arranged on the air inlet manifolds 1 are referred to as a first air inlet manifold electric valve 2*a*, a second air inlet manifold electric valve 2*b*, a third air inlet manifold electric valve 2*c*, and a fourth air inlet manifold electric valve 2*d* respectively. In this embodiment, the air inlet manifold electric valves 2 are controlled to be sequentially turned on from top down. Certainly, they may also be controlled sequentially as long as it is ensured that only one air inlet manifold electric valve 2 is turned on at one time and an air inlet manifold electric valve 2 that is off is turned on next time.

In some embodiments, first, only the first air inlet manifold electric valve 2*a* is turned on, and the second air inlet manifold electric valve 2*b*, the third air inlet manifold electric valve 2*c*, and the fourth air inlet manifold electric valve 2*d* are turned off. This running state remains for a first preset time period to ensure that a gas flowing into the airflow channel 15 is completely the gas to be detected entering from the first air inlet manifold 1*a*. It can be understood that a purpose of setting the first preset time period in this embodiment is for ensuring complete discharge of the gas present in the pipeline. If the laser intensity obtained by the control apparatus 19 still meets the fire early warning condition, it indicates that there is a fire in the monitoring region corresponding to the first air inlet manifold 1*a*, and a next monitoring region is detected. If the laser intensity obtained by the control apparatus 19 does not meet the fire early warning condition, it indicates that there is no fire in the monitoring region corresponding to the first air inlet manifold 1*a*, and the monitoring region is detected. Detecting the next monitoring region is detecting a monitoring region corresponding to the second air inlet manifold 1*b*. By that analogy, all the monitoring regions are detected by the above-mentioned method, so as to determine whether there is a fire in the monitoring regions.

In some embodiments, the control apparatus 19 may control one of the air inlet manifold electric valves 2 to be turned on in a regular polling manner, so as to detect air cleanliness of the monitoring region corresponding to each air inlet manifold 1.

In some embodiments, the filtering apparatus further includes:

a third stage filter 8, configured to filter a particulate matter in the second stage filtered gas to obtain a third stage filtered gas.

In some embodiments, the fire monitoring system further includes:

a booster pump 11 arranged on a clean gas tube 10. The clean gas tube 10 is communicated with the gas detecting tube 12. The booster pump 11 is configured to drive the third stage filtered gas to purge the laser transmitter 16 and the laser intensity detector 17.

In some embodiments, the second stage filtered gas is further filtered by a third stage filter 8 to filter a particulate matter that may be generated by combustion, etc. A gas obtained by filtering is a clean gas, and may purge the laser transmitter 16 and the laser intensity detector 17 under the action of a booster pump 11, so as to prevent the particulate matter clinging to them from affecting the detection result.

In some embodiments, the fire monitoring system further includes:

a gas detecting tube electric valve 9 arranged on the gas detecting tube 12, and a clean gas tube 10 electric valve arranged on the clean gas tube 10.

Correspondingly, the control apparatus 19 is further configured to, according to a current working condition, control the gas detecting tube electric valve 9 to be turned on and control the clean gas tube electric valve 18 to be turned off, or according to a current working condition, control the gas detecting tube electric valve 9 to be turned off and control the clean gas tube electric valve 18 to be turned on.

In some embodiments, in this embodiment, a gas detecting tube electric valve 9 is arranged on the gas detecting tube 12, and a clean gas tube 10 electric valve is arranged on the clean gas tube 10. The control apparatus 19 may control the gas detecting tube electric valve 9 and the clean gas tube electric valve 18 to cooperate to switch the fire monitoring system in a detection state and a purging state. It can be understood that the current working condition includes a working condition corresponding to the detection state and a working condition corresponding to the purging state. The current working condition may be selected flexibly by the user.

In some embodiments, the fire monitoring system further includes:

a gas detector, configured to monitor a toxic gas and/or harmful gas and/or combustible gas in the gas to be detected.

In some embodiments, the fire monitoring system in this embodiment is further provided with a gas detector. The gas detector is connected with the sampling apparatus, and may analyze toxic, harmful, and combustible gases in each monitoring region while detecting smoke, so as to actively prevent gas leakage, environmental contamination, bioterrorist attacks, etc., and improve the safety of the fire monitoring system.

In some embodiments, the control apparatus 19 includes a processor. The processor includes:

a calculation module, configured to calculate a weighted average corresponding to all laser intensities received within a second preset time period, and determine the weighted average as an actual laser intensity;

a comparison module, configured to compare the actual laser intensity with a preset alarm threshold;

a processing module, configured to determine whether the fire early warning condition is met according to a comparison result, and if YES, implement the early warning measure.

Figure 4:
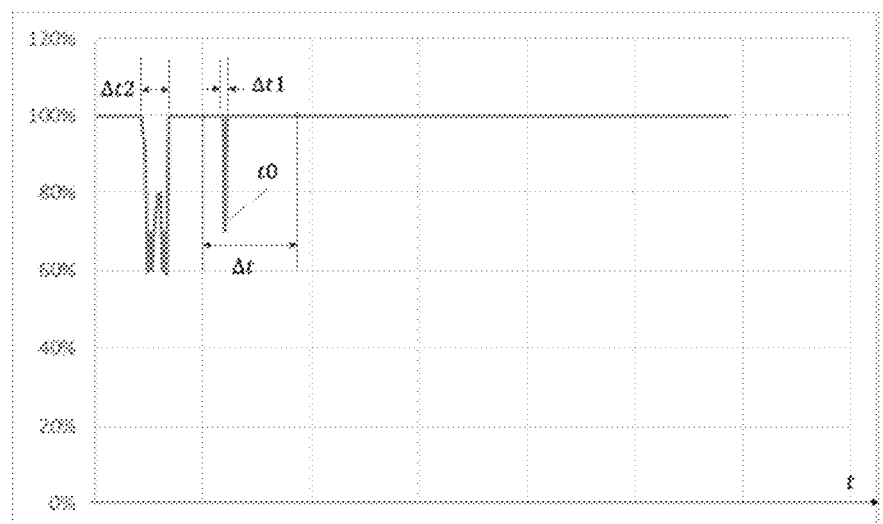
FIG. 4 is a schematic diagram of a laser intensity-time curve according to the present application.

It can be understood that, in the running process of the fire monitoring system, the second stage filtered gas continuously enters the airflow channel 15 and flows out of the gas outlet 14 of the detection apparatus. Meanwhile, the laser transmitter 16 continuously transmits laser signals, and the laser intensity detector 17 continuously detects intensities of lasers directly irradiating it. Then, a laser intensity-time curve may be obtained, as shown in FIG. 4. When the curve is analyzed, to improve the fire judgment reliability, in this embodiment, whether there is a fire in the monitoring region is not determined directly according to a certain time point, and instead, a weighted average of all laser intensities obtained within a second preset time period $\Delta t$ is determined as a current actual laser intensity for fire prejudgment. Descriptions will be made with an example.

A laser intensity detected by the laser intensity detector suddenly decreases to a at time t0, and then quickly returns to 100% of a normal level with a duration of $\Delta t1$. If an average intensity within the time period of $\Delta t1$ is b, a weighted average c of the laser intensities within the time period of $\Delta t$ is:

$$c = (\Delta t1 \times b + (\Delta t - \Delta t1) \times 100\%)/\Delta t.$$

It can be found by calculation that the weighted average c is still relatively large. In such case, there may be fine dust or other particles from the outside in the air, and it may not be determined that there is a fire. In FIG. 4, within a time period of $\Delta t2$, the intensity detected by the laser detector keeps decreasing, and the weighted average within the second preset time period $\Delta t$ is also relatively small. In such case, it may be determined that there is probably a fire.

In some embodiments, the preset alarm threshold includes preset alarm thresholds in one-to-one correspondence to multiple smoke grades.

The comparison module is configured to compare the actual laser intensity with each preset alarm threshold.

The processing module is configured to determine whether the fire early warning condition is met according to a comparison result, and if YES, determine a current smoke grade and implement an early warning measure corresponding to the current smoke grade.

In some embodiments, the control apparatus 19 prestores multiple preset alarm thresholds. Each smoke grade corresponds to a preset alarm threshold. After the actual laser intensity is obtained, the actual laser intensity is compared with each preset alarm threshold. Whether there is a fire may be determined according to a comparison result of the actual laser intensity and the preset alarm threshold corresponding to the smoke grade that is grade 1. Then, a current smoke grade is determined according to a threshold range where the actual laser intensity is. It is assumed that there are totally four smoke grades, and corresponding preset alarm thresholds are that the laser intensity is 95%, the laser intensity is 80%, the laser intensity is 70%, and the laser intensity is 60% respectively. If the actual laser intensity is greater than 95%, it indicates that there is no smoke. If the actual laser intensity is less than 95% and greater than 80%, it indicates that the current smoke grade is grade 1. If the actual laser intensity is less than 80% and greater than 70%, it indicates that the current smoke grade is grade 2. If the actual laser intensity is less than 70% and greater than 60%, it indicates that the current smoke grade is grade 3. If the actual laser intensity is less than 60%, it indicates that the current smoke grade is grade 4.

In some embodiments, the control apparatus 19 further includes:
multiple relays in one-to-one correspondence to the smoke levels. The processor is connected with a control loop corresponding to the early warning measure through the relay.

Correspondingly, the process of implementing an early warning measure corresponding to the current smoke grade includes:
controlling the relay corresponding to the current smoke grade to be turned on.

In some embodiments, the control apparatus 19 in this embodiment further includes multiple relays that may be controlled by a logic circuit in the control system. The relay is in one-to-one correspondence to the current smoke grade. In the running process, the actual laser intensity within the second preset time period Δt may be continuously detected and compared with the preset alarm thresholds corresponding to different smoke grades. After the smoke grade is determined according to the actual laser intensity, a loop corresponding to the smoke grade is turned on. In this embodiment, the relay output is used mainly because the relay may control a high current with a low current, so some high-power electrical devices may be connected to the relay to implement early warning measures under different smoke grades.

In some embodiments, the processor further includes:
a preprocessing module, configured to obtain an actual laser intensity corresponding to each smoke grade when a smoke generator simulates smoke of the multiple smoke grades in a target monitoring region;
a curve processing module, configured to obtain a first curve of time-dependent variation of the actual laser intensity and a second curve of time-dependent variation of the smoke grade;
a threshold determination module, configured to determine the preset alarm thresholds in one-to-one correspondence to the smoke grades in the target monitoring region according to the first curve and the second curve.

The target monitoring region is any one of the multiple monitoring regions in the container-type data center system.

In some embodiments, an application scenario of the fire monitoring system is complex and changeable, there are great differences between different monitoring regions in space and gas flowability, and these differences mean that actual laser intensities detected by the control apparatus 19 when fires of the same grade happen to different positions are different. For example, if there is a fire in a monitoring region with relatively high gas flowability, particulate matters generated by the fire may be diluted quickly by a gas flow, and a detected actual laser intensity is higher than that of a region with relatively low gas flowability. Based on this, this embodiment aims to predetermine, before the fire monitoring system performs fire monitoring, multiple preset alarm thresholds of different monitoring regions in one-to-one correspondence to multiple smoke grades to be directly used later, so as to improve the monitoring efficiency.

Figure 5:
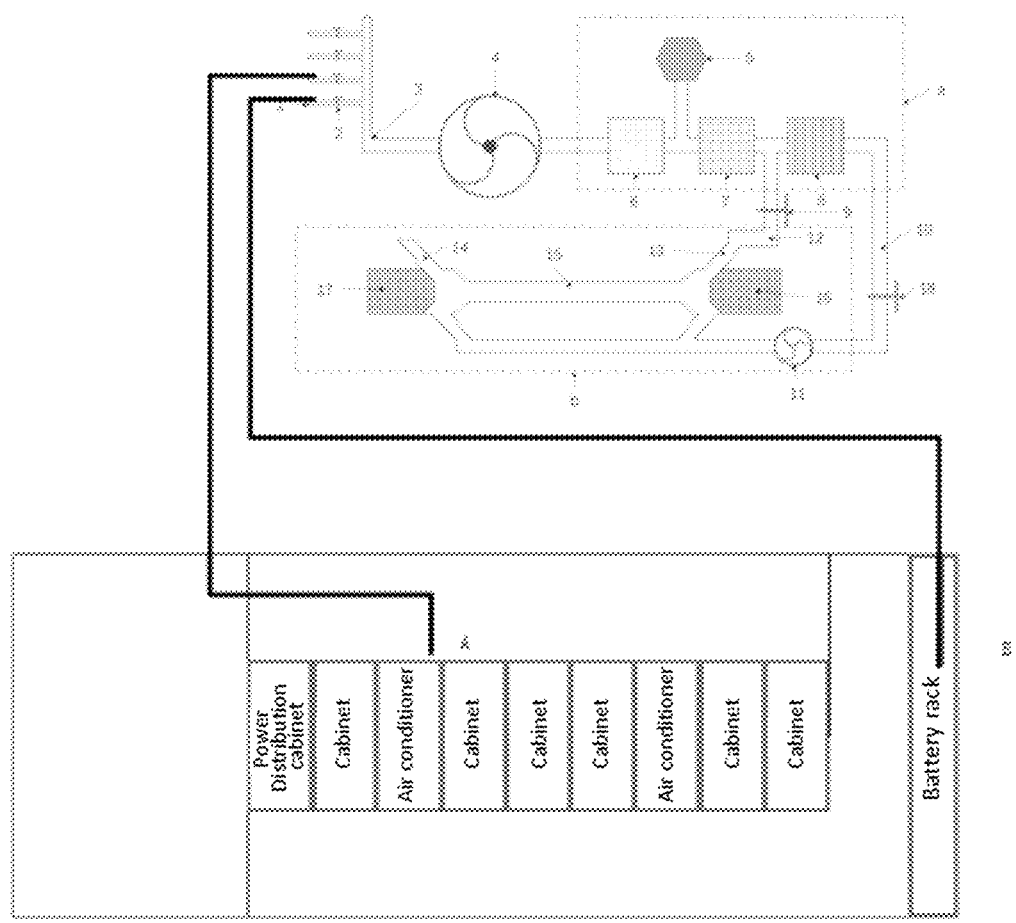
FIG. 5 is a schematic structural diagram of a container according to the present application.
Figure 6:
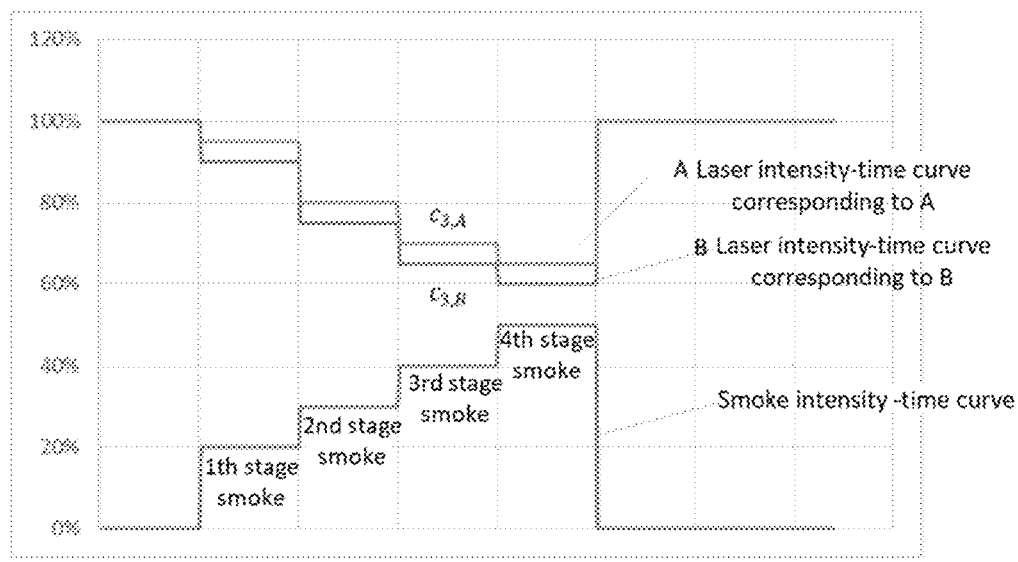
FIG. 6 is a schematic diagram of another laser intensity-time curve according to the present application.

In consideration of difficulties in theoretical calculation of different preset alarm thresholds corresponding to different monitoring regions, in this embodiment, a self-learning solution is used to set the preset alarm thresholds for different monitoring regions. For example, for a container shown in FIG. 5, air inlet manifolds 1 are arranged at an air conditioner return air inlet A and a battery rack region B respectively. First, a smoke generator is arranged at A to simulate smoke of different grades. All actual laser intensities obtained under a current smoke grade are obtained by a preprocessing module. A first curve of time-dependent variation of a laser intensity currently detected by the laser intensity detector 17 and a second curve of time-dependent variation of the smoke grade simulated by the smoke generator are recorded by a curve processing module. Then, the smoke generator is placed at B to simulate different smoke grades according to the same second curve of time-dependent variation of the smoke grade, and a first curve of time-dependent variation of a laser intensity currently detected by the laser intensity detector 17 is recorded. The smoke generator stably remains for a period of time under different smoke grades respectively, so it can be seen from FIG. 6 that there is a plateau for the laser intensities at A and B. For example, when smoke of grade 3 is generated, laser intensities at A and B are $c\_(3, A)$ and $c\_(3, B)$ respectively, and then alarm thresholds of A and B corresponding to the smoke of grade 3 are set to be $c\_(3, A)$ and $c\_(3, B)$.

Figure 7:
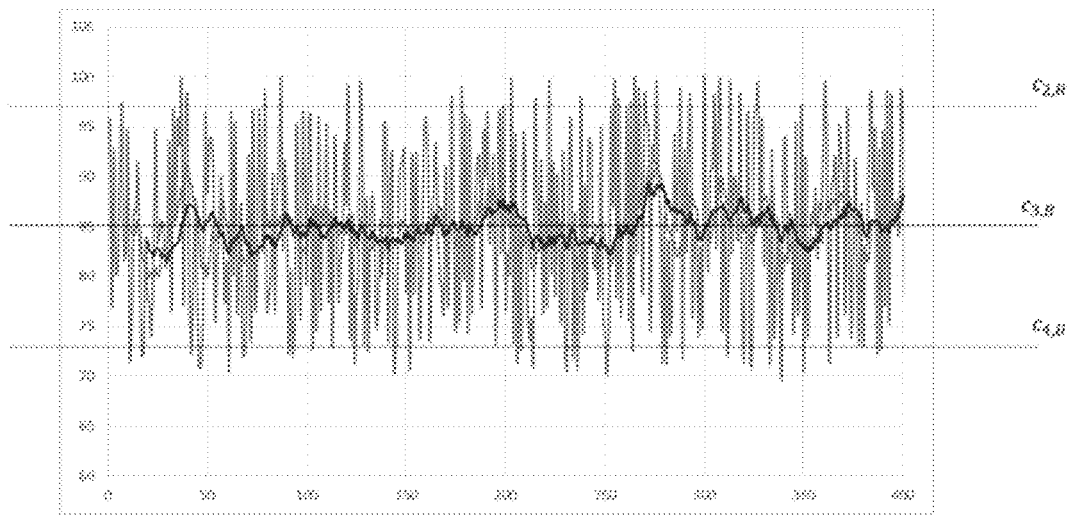
FIG. 7 is a schematic diagram of another laser intensity-time curve according to the present application.

Further, considering that the laser intensity-time curve is an ideal variation curve, in the present application, the variation of the laser intensity is a laser intensity reduction caused by the reduction of lasers directly irradiating the laser intensity detector 17 due to blocking of laser beams by the particulate matter in the sampled gas. However, the particulate matter blocks light randomly. This means that the laser intensity detected by the laser intensity detector 17 presents a random varying curve. This condition is more apparent in case of relatively low concentration of the particulate matter. If the smoke generator keeps generating smoke of grade 3 at B, during actual detection, the laser intensity presents a sharp varying curve, as shown in FIG. 7. The laser intensity may exceed previous and next thresholds $c\_(2, B)$ and $c\_(4, B)$ of the threshold $c\_(3, B)$ corresponding to the smoke of grade 3 at some time points. If real-time data is directly used for alarming, it is very likely to give a false alarm. It is necessary to perform denoising by weighted averaging.

Apparently, if a value of the second preset time period Δt is larger, the curve is smoother and closer to the threshold $c\_(3, B)$ corresponding to the smoke of grade 3. However, when the value of Δt is too large, the time sensitivity of the detection apparatus may be reduced. Therefore, it is necessary to perform weighted averaging on the real-time curve by use of different Δt to find a value of Δt capable of ensuring both the time sensitivity and the detection accuracy. On the other hand, as described above, different monitoring regions and different smoke grades may affect the variation of the laser intensity-time curve. For example, for a monitoring region where the gas flow varies sharply, a laser intensity-time curve may vary sharply. The laser intensity-time curve in case of high content of the particulate matter may vary more stably than that in case of low content of the particulate matter. Therefore, it is also necessary to analyze the laser intensity-time curve for different positions and different smoke grades to set different values of Δt.

In summary, the fire monitoring system provided in the present application may detect the gas to be detected in each monitoring region in the early stage of a fire, i.e., stages where no visible smoke is generated, such as overheating, smoldering, or preliminary generation of aerosol. If the content of the particulate matter in the gas to be detected is relatively high, an early warning measure is implemented, such as giving a fire early warning. In addition, a monitoring region where there is a potential hazard may be positioned accurately, and a corresponding protective measure is timely implemented for this monitoring region. The early warning time is a few hours or even more earlier than a conventional smoke detector, whereby very early detection and very early disposal may be implemented to minimize the loss caused by the fire.

In a further aspect, the present application also provides a container-type data center type, including the fire monitoring system as described above.

The container-type data center system provided in the present application has the same beneficial effects as the fire monitoring system.

Introductions about the container-type data center system provided in the present application refer to the above-mentioned embodiment, and elaborations are omitted in the present application.

It is also noted that in this specification, relationship terms such as first and second are used only to distinguish one entity or operation from another entity or operation, without necessarily requiring or implying any such actual relationship or order between those entities or operations. Further, the terms "include" "comprise" or any other variation thereof are intended to cover non-exclusive inclusion, so that a process, method, article, or apparatus that includes a set of elements includes not only those elements, but also other elements not expressly listed, or also include elements that are inherent to such process, method, article, or apparatus. With no more restrictions, an element defined by statement "including a/an . . . " does not exclude the existence of the same other elements in a process, method, object, or device including the element.

The disclosed embodiments are described above to enable those skilled in the art to implement or use the present application. Various modifications to these embodiments are apparent to those skilled in the art. The general principle defined herein may be implemented in other embodiments without departing from the spirit or scope of the present application. Therefore, the present application will not be limited to these embodiments shown herein but is consistent with the largest scope consistent with the principles and novel characteristics disclosed herein.

What is claimed is:

1. A fire monitoring system, comprising:
   a filtering apparatus, comprising a first stage filter and a second stage filter, wherein the first stage filter is configured to filter water mist in a gas to be detected in a container-type data center system to obtain a first stage filtered gas, and the second stage filter is configured to filter dust in the first stage filtered gas to obtain a second stage filtered gas;
   a detection apparatus, comprising a linear airflow channel in communication with the second stage filter by means of a gas detecting tube, as well as a laser transmitter and a laser intensity detector that are arranged at both ends of the linear airflow channel respectively, wherein the laser transmitter is configured to transmit a laser signal, and the laser intensity detector is configured to obtain a laser intensity of the laser signal;
   a control apparatus electrically connected with the laser intensity detector, configured to implement an early warning measure in response to determining that the obtained laser intensity meets a fire early warning condition; and
   a gas receiving apparatus, comprising multiple air inlet manifolds in one-to-one correspondence to multiple monitoring regions in the container-type data center system, wherein the gas receiving apparatus further comprises an air inlet manifold electric valve arranged on each of the multiple air inlet manifolds,
   wherein the control apparatus is further configured to control:
      all of the air inlet manifold electric valves to be turned on in response to determining that the fire early warning condition is not met, and
      control each of the air inlet manifold electric valves to be sequentially turned on in response to determining that the fire early warning condition is met, and in response to controlling one of the air inlet manifold electric valves to be turned on, control all other of the air inlet manifold electric valves to be turned off, and
   wherein the control apparatus comprises a processor, and the processor is configured for:
      comparing the obtained laser intensity with a preset alarm threshold, determining whether the fire early warning condition is met according to a comparison result, and in response to the fire early warning condition being met according to the comparison result, implementing the early warning measure;
      obtaining an actual laser intensity corresponding to each smoke grade when a smoke generator simulates smoke of multiple smoke grades in a target monitoring region;
      obtaining a first curve of time-dependent variation of the actual laser intensity and a second curve of time-dependent variation of the smoke grade; and
      determining a plurality of preset alarm thresholds, each of the plurality of preset alarm thresholds in one-to-one correspondence to the multiple smoke grades in the target monitoring region according to the first curve and the second curve, wherein the target monitoring region is any one of the multiple monitoring regions in the container-type data center system.

2. The fire monitoring system according to claim 1, wherein the first stage filter comprises:
   a condensation chamber, provided with a gas inlet;
   a heating chamber, wherein a gas inlet of the heating chamber is in communication with a gas outlet of the condensation chamber, and the heating chamber is provided with a gas outlet connected with the second stage filter; and
   a thermoelectric device, wherein a cold end of the thermoelectric device is connected with the condensation chamber so as to cool the gas in the condensation chamber, and a hot end of the thermoelectric device is connected with the heating chamber, and controls the cooled gas to be heated.

3. The fire monitoring system according to claim 2, wherein at least one of:
   a condensation section vapor chamber is arranged at the cold end of the thermoelectric device, and multiple condenser tubes extending into the condensation chamber are arranged on the condensation section vapor chamber; or
   a heating section vapor chamber is arranged at the hot end of the thermoelectric device, and multiple heating tubes extending into the heating chamber are arranged on the heating section vapor chamber.

4. The fire monitoring system according to claim 3, wherein a first stage filter second drainage port is formed in a bottom of each of the multiple condenser tubes.

5. The fire monitoring system according to claim 3, wherein the first stage filter further comprises a first stage filter housing, the condensation chamber, the heating chamber, and the thermoelectric device are all arranged in the first stage filter housing, and a first stage filter first drainage port below the condensation section vapor chamber is formed in a bottom of the first stage filter housing.

6. The fire monitoring system according to claim 4, wherein the condensation chamber is in communication with the heating chamber by means of a chamber connecting corridor, the chamber connecting corridor comprises a chamber connecting corridor shell, and a baffle plate configured to increase a flowing path of the gas is arranged in the chamber connecting corridor shell.

7. The fire monitoring system according to claim 6, wherein a drainage channel configured for liquid separated from the gas to flow out is formed in a bottom of the chamber connecting corridor shell.

8. The fire monitoring system according to claim 1, wherein the filtering apparatus further comprises:
a third stage filter, configured to filter a particulate matter in the second stage filtered gas to obtain a third stage filtered gas.

9. The fire monitoring system according to claim 8, further comprising:
a booster pump arranged on a clean gas tube, wherein the clean gas tube is in communication with the gas detecting tube, and the booster pump is configured to drive the third stage filtered gas to purge the laser transmitter and the laser intensity detector.

10. The fire monitoring system according to claim 9, further comprising:
a gas detecting tube electric valve arranged on the gas detecting tube, and a clean gas tube electric valve arranged on the clean gas tube.

11. The fire monitoring system according to claim 1, further comprising:
a gas detector, configured to monitor at least one of a toxic gas, a harmful gas, or a combustible gas in the gas to be detected.

12. The fire monitoring system according to claim 1, wherein each air inlet manifold of the multiple air inlet manifolds is configured to obtain the gas to be detected in a corresponding monitoring region of the multiple monitoring regions, a main air inlet pipe is connected with each of the multiple air inlet manifolds, and an air pump is configured to drive the gas to be detected being arranged on the main air inlet pipe.

13. The fire monitoring system according to claim 12, further comprising:
an air cleanliness detection apparatus, configured to obtain air cleanliness data of the container-type data center system according to the first stage filtered gas.

14. The fire monitoring system according to claim 1, wherein the control apparatus is configured to wait for a first preset time period after controlling each of the air inlet manifold electric valves to be turned on, then determine whether the obtained laser intensity meets the fire early warning condition, and when the obtained laser intensity meets the fire early warning condition, implement the early warning measure.

15. A container-type data center system, comprising a fire monitoring system, wherein the fire monitoring system comprises:
a filtering apparatus, comprising a first stage filter and a second stage filter, wherein the first stage filter is configured to filter water mist in a gas to be detected in the container-type data center system to obtain a first stage filtered gas, and the second stage filter is configured to filter dust in the first stage filtered gas to obtain a second stage filtered gas;
a detection apparatus, comprising a linear airflow channel in communication with the second stage filter by means of a gas detecting tube, as well as a laser transmitter and a laser intensity detector that are arranged at both ends of the linear airflow channel respectively, wherein the laser transmitter is configured to transmit a laser signal, and the laser intensity detector is configured to obtain a laser intensity of the laser signal;
a control apparatus electrically connected with the laser intensity detector, configured to implement an early warning measure in response to determining that the obtained laser intensity meets a fire early warning condition;
a gas receiving apparatus, comprising multiple air inlet manifolds in one-to-one correspondence to multiple monitoring regions in the container-type data center system, wherein the gas receiving apparatus further comprises an air inlet manifold electric valve arranged on each of the multiple air inlet manifolds,
wherein the control apparatus is further configured to:
control all of the air inlet manifold electric valves to be turned on in response to determining that the fire early warning condition is not met, and
control each of the air inlet manifold electric valves to be sequentially turned on in response to determining that the fire early warning condition is met, and in response to controlling one of the air inlet manifold electric valves to be turned on, control all other of the air inlet manifold electric valves to be turned off, and
wherein the control apparatus comprises a processor, and the processor is configured for:
comparing the obtained laser intensity with a preset alarm threshold, determining whether the fire early warning condition is met according to a comparison result, and in response to the fire early warning condition being met according to the comparison result, implementing the early warning measure;
obtaining an actual laser intensity corresponding to each smoke grade when a smoke generator simulates smoke of multiple smoke grades in a target monitoring region;
obtaining a first curve of time-dependent variation of the actual laser intensity and a second curve of time-dependent variation of the smoke grade; and
determining a plurality of preset alarm thresholds, each of the plurality of preset alarm thresholds in one-to-one correspondence to the multiple smoke grades in the target monitoring region according to the first curve and the second curve, wherein the target monitoring region is any one of the multiple monitoring regions in the container-type data center system.

16. The fire monitoring system according to claim 10, wherein the control apparatus is further configured to, according to a current working condition, control the gas detecting tube electric valve to be turned on and control the clean gas tube electric valve to be turned off.

17. The fire monitoring system according to claim 10, wherein the control apparatus is further configured to, according to a current working condition, control the gas detecting tube electric valve to be turned off and control the clean gas tube electric valve to be turned on.

18. The fire monitoring system according to claim 13, wherein the control apparatus is further configured to control the filtering apparatus, the detection apparatus, and the gas receiving apparatus to stop running in response to determining that the air cleanliness data is less than a first preset value.

* * * * *